United States Patent [19]

Fiorina et al.

[11] Patent Number: 4,903,185
[45] Date of Patent: Feb. 20, 1990

[54] FILTERING DEVICE OF THE COMMON MODE DISTURBANCES AFFECTING THE PRINTED CIRCUIT BOARDS OF A STATIC POWER CONVERTER

[75] Inventors: Jean-Noël Fiorina, Seyssinet-Pariset; Hervé Denis, Echirolles, both of France

[73] Assignee: Merlin Gerin, Grenoble Cedex, France

[21] Appl. No.: 218,262

[22] Filed: Jul. 13, 1988

[30] Foreign Application Priority Data

Jul. 23, 1987 [FR] France .............................. 87 10521

[51] Int. Cl.$^4$ ............................................... H02M 1/14
[52] U.S. Cl. ........................................ 363/40; 363/98; 333/12; 333/181
[58] Field of Search ...................... 363/39, 40, 41, 17, 363/98, 132; 333/12, 177, 181, 182, 183, 184, 185; 361/110, 111, 113, 118, 119, 56, 91; 336/212, 214, 223, 83, 175

[56] References Cited

U.S. PATENT DOCUMENTS

| | | | |
|---|---|---|---|
| 3,388,351 | 6/1968 | Sweetana, Jr. | 333/184 |
| 3,551,858 | 12/1970 | Cielo | 333/182 |
| 4,259,705 | 3/1981 | Stifter | 361/56 |
| 4,636,752 | 1/1987 | Saito | 333/181 X |
| 4,760,355 | 7/1988 | Dash et al. | 333/185 X |

OTHER PUBLICATIONS

Patent Abstracts of Japan, vol. 4, No. 4 (E-164), Jan. 12, 1980, p. 133 E 164, JP 54-144851.

Primary Examiner—Patrick R. Salce
Assistant Examiner—Kristine Peckman
Attorney, Agent, or Firm—Arnold, White & Durkee

[57] ABSTRACT

The control and monitoring data transmission conductors between the control board and the transistor conversion circuit are formed into a flexible flat cable whose intermediate part is wound on a single magnetic circuit to constitute a common mode inductance designed to compensate the disturbances affecting the printed circuit board due to the potential changes of the semi-conductors generated when switching takes place from the conducting state to the blocking state, and vice-versa.

3 Claims, 7 Drawing Sheets

FILTERING DEVICE OF THE COMMON MODE DISTURBANCES AFFECTING THE PRINTED CIRCUIT BOARDS OF A STATIC POWER CONVERTER

BACKGROUND OF THE INVENTION

The invention relates to a static power converter, notably for an uninterruptible power supply system, comprising a conversion circuit having a plurality of power semi-conductors, a control board for controlling the semi-conductors of the conversion circuit, and means for supplying electrical power to the control board.

The problems encountered in operation of a static converter involve transmission of the electronics control data at a low level to the conversion circuit power semi-conductors, notably the thyristors of a battery charger, or the transistors of an inverter stack. The conductors carrying this data are subjected to common mode disturbances due to the sudden potential changes of the semi-conductors which they control, when the latter become conducting or blocking. These disturbances can affect the operation of the control boards. A solution to minimize the influence of these disturbances consists in limiting the current flow by inserting a compensating coil between each power semiconductor and the control conductors involved on the board. The inductance achieved does not affect transmission of the useful signals, but prevents currents of the same instantaneous value flowing on two wires.

A wide range of current compensating coils with different current intensity and impedance characteristics are available in the trade. These coils come in the form of individual components having connecting lugs which have to be soldered into the circuit. A conversion circuit of a static converter has a certain number of power semi-conductors, and the range of an uninterruptible power supply system moreover involves different power levels (for example 10 kVA, 20 kVA . . . 80 kVA). There must be a predetermined compensating coil impedance to correspond to each power and each type of conversion circuit. It can be noted that a multitude of compensating coils would be required to obtain efficient attenuation of the noise generated by operation of the converter. Furthermore, individual soldering of these coils complicates manufacture of the converter.

The object of the invention consists in simplifying the noise suppression operation of a static power converter.

SUMMARY OF THE INVENTION

The converter according to the invention is characterized in that all the control and monitoring data transmission conductors between the control board and the conversion circuit are formed into a flexible flat cable or strand, whose intermediate part is wound onto a single magnetic circuit to constitute a common mode inductance, designed to compensate the disturbances affecting the printed circuit board due to the potential changes of the semi-conductors generated when switching takes place from the conducting state to the blocking state, and vice-versa.

Each control board has associated with it a single common mode inductance. The magnetic circuit of the inductance is standard for all powers, the impedance value being adjusted by the number of turns of the flat cable or strand. The common mode inductance is achieved and inserted without requiring any soldering operations.

The conversion circuit power semi-conductors comprise transistors or thyristors having a predetermined coupling to define either stack inverter modules, or a rectifier-charger module, or a static switch module, each respectively having an appropriate control board and a common mode inductance.

The various control boards of said uninterruptible power supply system modules are supplied by a common power supply board. The power conductors coming from the battery, from the A.C. mains, or from an auxiliary control, are formed into a single strand wound onto a magnetic circuit to form a common mode inductance included in the power supply to the power supply board.

BRIEF DESCRIPTION OF THE DRAWINGS

Other advantages and features will become more clearly apparent from the following description of several illustrative embodiments of the invention, given as non-restrictive examples only and represented in the accompanying drawings, in which.

DESCRIPTION OF THE PREFERRED EMBODIMENT

Figure 1:
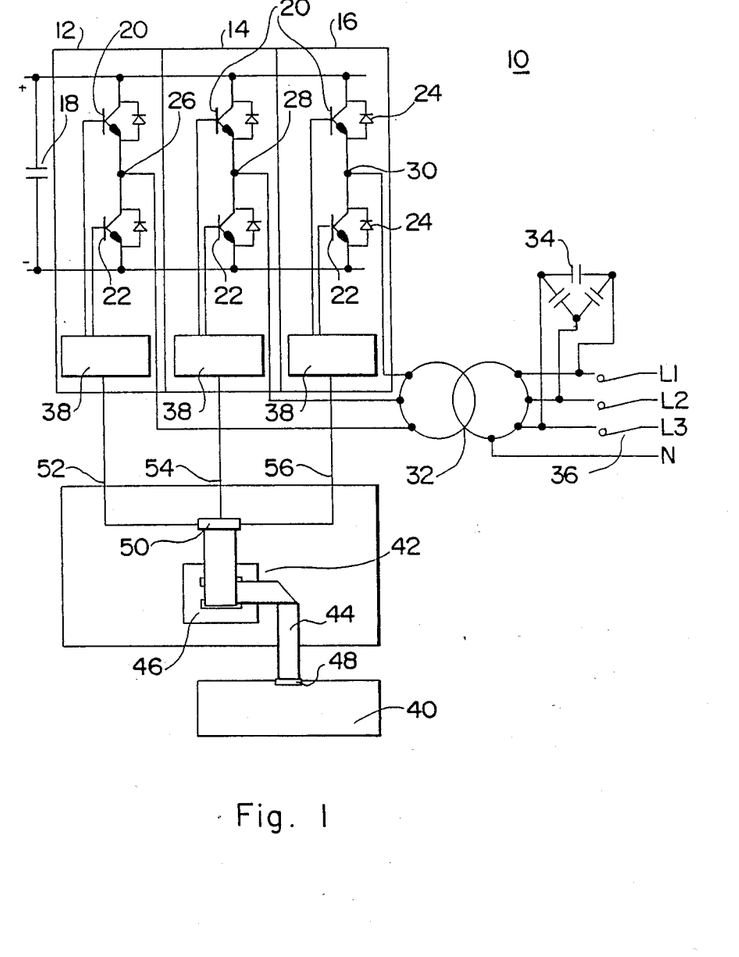
FIG. 1 represents the block diagram of a three-phase inverter stack equipped with the common mode inductance according to the invention.

Referring now to FIG. 1, a three-phase inverter stack 10 comprises three inverter modules 12, 14, 16 having identical structures, with parallel connection to the terminals of a capacitor 18, and of a DC power supply. Each inverter 12, 14, 16 comprises two power transistors 20, 22 connected in series, the collector of the transistor 20 being electrically connected to the positive pole of the DC power supply, and the emitter of the transistor 22 being connected to the negative pole. A protective diode 24 is reverse mounted between the collector and emitter of each transistor 20, 22. The mid-point 26, 28, 30 arranged between the emitter of the transistor 20 and the collector of the transistor 22 of each module 12, 14, 16 is connected to the primary winding of a three-phase transformer 32. The receiver (not shown) is supplied by the active conductors L1, L2, L3, N, connected to the secondary winding of the transformer 32 with a capacitor cell 34 and a protective circuit breaker 36 fitted in between.

Each inverter module 12, 14, 16 comprises in addition a power amplifier 38 connected to the bases of the transistors 20, 22. Operation of the different modules 12, 14, 16 of the inverter stack 10 is controlled by a control board 40, of the type described in French Patent applications 8,612,963 and 8,612,962 filed by the applicant.

Figure 4:
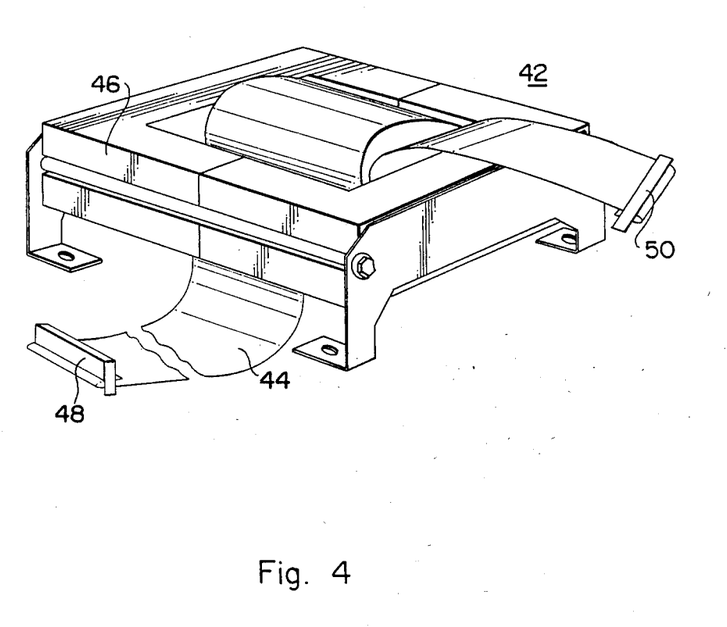
FIG. 4 represents an enlarged scale view of the common mode inductance used in the circuit in FIG. 1.

A common mode inductance 42, accomplished by means of a flat cable 44 or braid of twenty-six wires, wound on the center core of a single rectangular-shaped magnetic circuit 46, is inserted in the electrical connection of the board 40 with the three power amplifiers 38 (FIG. 4). One of the ends of the flat cable 44 is equipped with a first connector designed to plug into a conjugate connector of the board 40. The other end bears a second connector 50 to which three strands of wires 52, 54, 56, respectively connected to the power amplifier 38 of the three modules 12, 14, 16, are connected.

The twenty-six wires of the flat cable 44 represent the entirety of the conductors relative to the controls and the monitoring data of the six power transistors 20, 24 of the modules 12, 14, 16. The intermediate part of the flat cable 44 wound onto the magnetic circuit 46 forms the coil of the inductance 42, and the reactance value depends on the number of turns wound onto the magnetic circuit 46. Each power of the inverter stack 10 has corresponding to it a predetermined value of the filtering inductance 42 to obtain optimum compensation of the common mode disturbances affecting the control and monitoring conductors subsequent to the sudden potential changes generated in the conducting and blocking phases of the transistors 20, 22. The magnetic circuit 46 is standard for all the values of the inductance 42, only the number of turns of the flat cable 44 on the center core changes. Incorporating the inductance 42 according to FIG. 4 in the connection of the board 40 with the strands 52, 54, 56 is accomplished without soldering, the coil of the inductance 42 being achieved by winding the flexible flat cable 44. A single common mode inductance is sufficient for all the transistors 20, 22 of the three-phase inverter stack 10.

Figure 2:
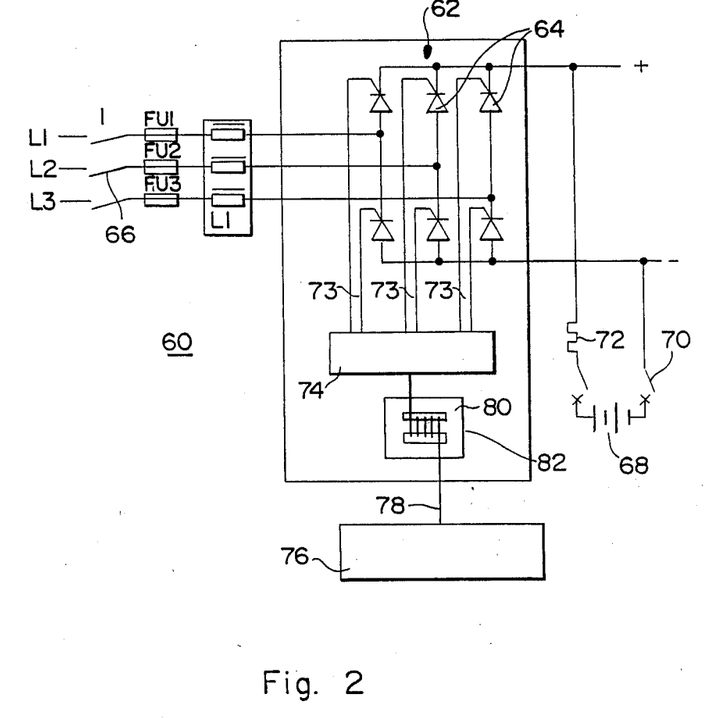
FIG. 2 shows the insertion of the common mode inductance in the controls of a rectifier-charger.

According to FIG. 2, a rectifier/charger module 60 comprises a three-phase Graetz bridge 62 equipped with six thyristors 64. The input of the bridge 62 is connected to the active conductors L1, L2, L3 of the A.C. mains supply, via a switch 66 and fuses FU1, FU2, FU3. The output of the bridge 62 is connected to the inverter stack of FIG. 1, with a battery circuit 68 mounted in parallel comprising a switch 70, and a resistor 72. The triggers of the thyristors 64 of the bridge 62 are electrically connected by conductors 73 to a power amplifier 74. Adjustment of the firing angle of the thyristors enabling the output voltage of the bridge 62 to be adjusted is performed by a control board 76. The electrical connection between the board 76 and the power amplifier 74 is achieved by means of a strand 78 with multiple wires 79, whose intermediate part is wound around a magnetic circuit 80 to form a common mode inductance 82.

Figure 5:
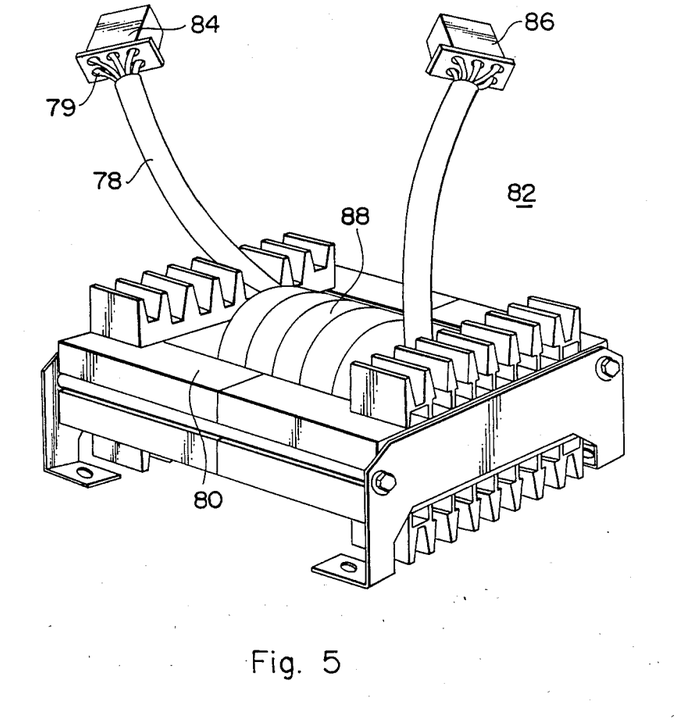
FIG. 5 is an alternative embodiment of FIG. 4 of a common mode inductance used in the circuits in FIGS. 2 and 3.

The common mode inductance 82 is represented in FIG. 5, and the different wires 79 making up the strand 78 are connected by their opposite ends to two connectors 84, 86 designed to be plugged into the board 76 and the printed circuit of the amplifier 74. The coil 88 of the inductance 82 is formed by the spiral winding of the strand 78 on the internal branch of the magnetic circuit 80. It can be noted that the control connections of the thyristors 64 of the rectifier/charger module 60 have been grouped together in the same strand, itself wound around a common magnetic circuit 80 to constitute the common mode inductance 82.

Figure 3:
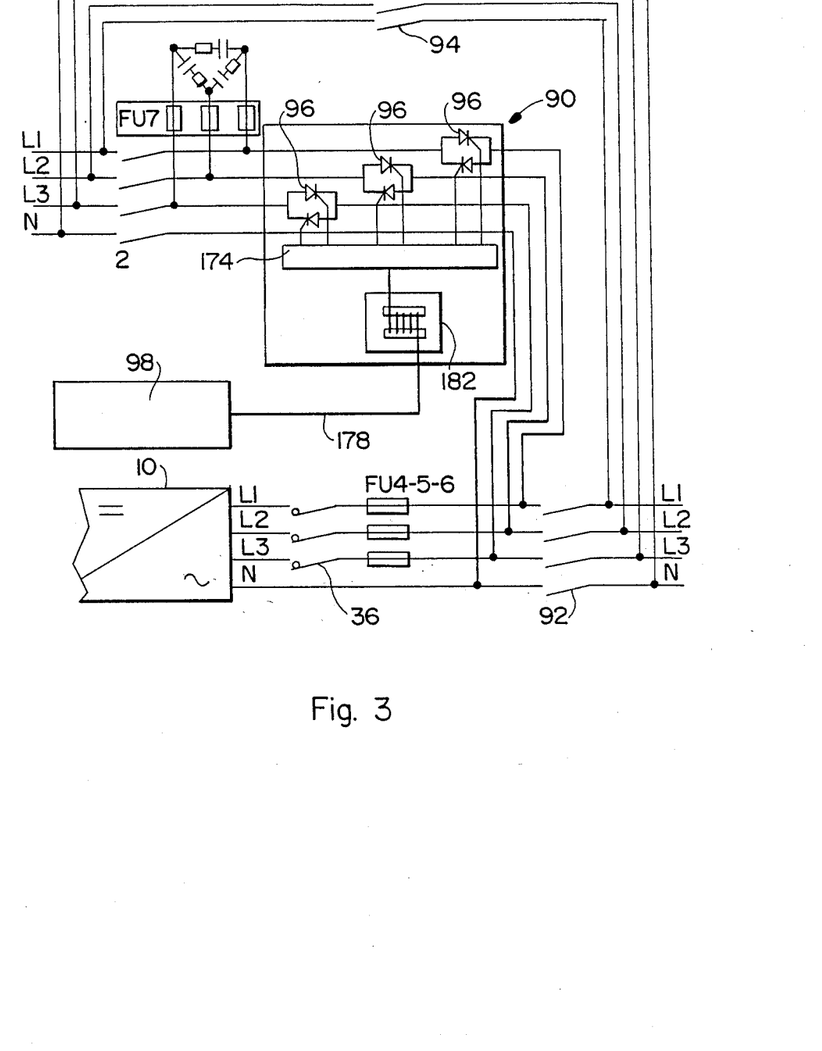
FIG. 3 represents an alternative embodiment applied to a static switch.

According to FIG. 3, a static switch module 90 is electrically inserted between a second A.C. mains supply (mains 2), and the output of the inverter stack 10. The load is connected to the outputs of the inverter stack 10 and of the static switch module 90 by means of a switch 92. A by-pass circuit with connecting circuit breaker 94, is parallel connected directly between the mains 2 and the load to shunt the static switch module 90.

The static switch module 90 comprises a pair of thyristors 96 mounted head-to-tail, or a triac in each active conductor L1, L2, L3 of the mains 2. The triggers of the thyristors 96 are connected to a power amplifier 174 controlled by a control board 98. The board 98 is connected to an amplifier 174 by a strand connector 178 and a common mode inductance 182 of the type illustrated in FIG. 5.

Figure 6:
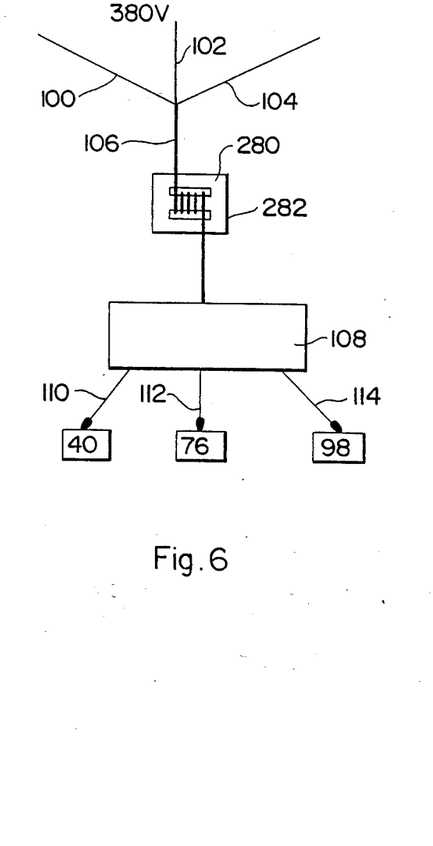
FIG. 6 shows the insertion of the common mode inductance in the converter power supply circuit.

In FIG. 6, all the power conductors 100, 102, 104 coming from the battery 68, from the 380 V mains, and from a D.C. contactor control are formed into a single six-wire strand 106, electrically connected to a power supply board 108, for example of the chopping type. The intermediate part of the strand 106 is wound onto a magnetic circuit 280 to form a common mode inductance 282 of the type illustrated in FIG. 5. The inductance 282 is included in the power supply to the power supply board 108. The power conductors 110, 112, 114 at the output of the power supply board 108 do not carry any common mode disturbance to the other control boards 40, 76, 98.

Figure 7:
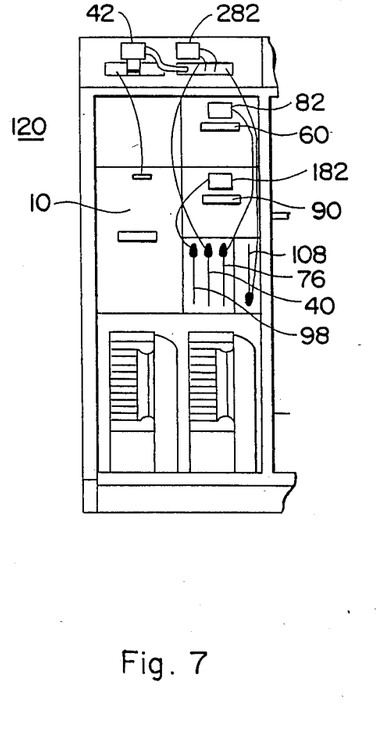
FIG. 7 illustrates the layout of the different common mode inductances in an uninterruptible power supply system.

FIG. 7 shows a layout example of the different common mode inductances 42, 82, 182, 282 in an uninterruptible power supply system 120 having powers comprised between 10 and 20 kVA. The architecture of the uninterruptible power supply 120 is described in detail in French Patent applications 8,617,709 and 8,617,710 filed by the applicant, and the common mode inductances 42, 82, 182, 282 have been located in the vicinity of the power semi-conductor modules and the corresponding control boards.

We claim:

1. A static power converter, notably for an uninterruptible power supply system, comprising:
   a conversion circuit having a plurality of power semi-conductors,
   a control board for controlling the semi-conductors of said conversion circuit,
   means for supplying electrical power to the control board,
   all control and monitoring data transmission conductors between the control board and the conversion circuit being formed into a flexible flat cable or strand, whose intermediate part is wound onto a single magnetic circuit to constitute a common mode inductance, designed to compensate the disturbances affecting said control board, due to the variation of potential upon switching of the semi-conductors between the conducting state and the blocking state.

2. A static power converter, notably for an uninterruptible power supply system, comprising:
   a conversion circuit having a plurality of power semi-conductors;
   a control board for controlling the semi-conductors of said conversion circuit;
   means for supplying electrical power to the control board;
   all control and monitoring data transmission conductors between the control board and the conversion circuit being formed into a flexible flat cable or strand, whose intermediate part is wound onto a single magnetic circuit to constitute a common mode inductance, designed to compensate the disturbances affecting said control board, due to the variation of potential upon switching of the semi-conductors between the conducting state and the blocking state; and a common power supply board connected to a main supply by power conductors, said power conductors being formed into a single strand wound onto a magnetic circuit to constitute a common mode inductance associated with the common power supply board.

3. A static power converter, notably for an uninterruptible power supply system, comprising:

a conversion circuit having a plurality of power semi-conductors;

a control board for controlling the semi-conductors of said conversion circuit;

means for supplying electrical power to the control board;

all control and monitoring data transmission conductors between the control board and the conversion circuit being formed into a flexible flat cable or strand, whose intermediate part is wound onto a single magnetic circuit to constitute a common mode inductance, designed to compensate the disturbances affecting said control board, due to the variation of potential upon switching of the semi-conductors between the conducting state and the blocking state, said flexible flat cable or strand comprising at each end a connector facilitating insertion of the common mode inductance between the control board and the conversion circuit.

* * * * *